(12) United States Patent
Liang et al.

(10) Patent No.: US 7,541,827 B2
(45) Date of Patent: Jun. 2, 2009

(54) BGA PACKAGE HOLDER DEVICE AND METHOD FOR TESTING OF BGA PACKAGES

(75) Inventors: Shan An Liang, Shanghai (CN); Chun Kui Ji, Shanghai (CN); Ping Lung Liao, Shanghai (CN); Tian Qin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 245 days.

(21) Appl. No.: 11/450,967

(22) Filed: Jun. 9, 2006

(65) Prior Publication Data
US 2007/0252609 A1    Nov. 1, 2007

(30) Foreign Application Priority Data
Apr. 30, 2006    (CN) .................. 2006 1 0026322

(51) Int. Cl.
*G01R 31/28* (2006.01)
*H01R 9/09* (2006.01)
(52) U.S. Cl. ................... 324/765; 324/755; 439/70
(58) Field of Classification Search ......... 324/754–765
See application file for complete search history.

(56) References Cited

U.S. PATENT DOCUMENTS 6,012,929 A * 1/2000 Matsumura .............. 439/70
6,208,155 B1 * 3/2001 Barabi et al. ............. 324/754
7,068,059 B2 * 6/2006 Hanke et al. ............. 324/765
7,307,443 B2 * 12/2007 Toh et al. ................. 324/765
2002/0027941 A1 * 3/2002 Schlagheck et al. ......... 374/5
2002/0043983 A1 * 4/2002 Cheng .................... 324/755
2006/0081583 A1 * 4/2006 Hembree et al. ........... 219/209

FOREIGN PATENT DOCUMENTS

KR    2005063858    * 6/2005

* cited by examiner

*Primary Examiner*—Ha Tran T Nguyen
*Assistant Examiner*—Emily Y Chan
(74) *Attorney, Agent, or Firm*—Townsend and Townsend and Crew LLP

(57) ABSTRACT

An apparatus for supporting BGA packages for one or more testing processes is disclosed. The apparatus includes a substrate member. The substrate member has a plurality of contact pads, with each of the contact pads being spatially disposed around a peripheral region of the substrate. The apparatus further includes a plurality of contact regions spatially configured on a portion of the substrate member. Each of the plurality of contact regions is numbered from 1 through N being electrically connected to respective contact pads numbered from 1 through N. The plurality of contact regions is configured to provide electrical contact to respective plurality of balls provided on a BGA package. The apparatus additionally includes a holder device coupled to the substrate member. The holder device is adapted to mechanically hold the BGA package in place to provide mechanical contact between the plurality of balls and respective plurality of contact regions.

12 Claims, 11 Drawing Sheets

BGA PACKAGE HOLDER DEVICE AND METHOD FOR TESTING OF BGA PACKAGES

CROSS-REFERENCES TO RELATED APPLICATIONS

This application claims priority to Chinese Patent Application No. 200610026322.9, filed Apr. 30, 2006, entitled "New BGA package holder for application on EMMI&OBIRCH electrical analysis" by Inventors Shan An Liang, Chun Kui Ji, Ping Lung Liao, and Tian Qin commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits and their processing for the manufacture of semiconductor devices. More particularly, the invention provides a method and apparatus for supporting BGA packages during one or more testing processes. Merely by way of example, the invention can be used to perform testing of the BGA packages without having to directly test the electrical components located within the BGA package. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. After the individual devices have been manufactured within the IC fabrication facility, the devices must be tested and packaged to ensure the reliability of the manufactured circuits. A technique that can be used to package the manufactured circuits is in a ball grid array (BGA) package, where the circuit is encapsulated within a molding material to protect the circuit from exposure or undesired contact. Solder balls are attached to the base of the package to provide a reliable electrical connection from the integrated circuit.

After a packaging process has been performed on an integrated circuit, it may be necessary to decapsulate or open the package to facilitate analysis or electrical examination of the integrated circuit or its internal features. For example, thermal testing may be performed on the exposed circuit after decapsulation to determine if hotspots are present on the chip after the circuit has been cycled in operation. Another reason for decapsulation of a package can be to check for crossed wires or pinholes within the integrated circuit. A decapsulation process can consist of a purely mechanical process such as prying or cutting away the encapsulant layer, or may be performed using a chemical etch, plasma etch, or thermomechanical removal process to remove the encapsulant layer.

After decapsulation has been performed, additional testing of the integrated circuit or BGA package can be performed. Two exemplary types of testing that may be performed following decapsulation are Emission Microscopy (EMMI) and Optical Beam Induced Resistance Change (OBIRCH) analysis. These optical analysis techniques utilize a camera to capture either optical or photocurrent images of the circuit. Device defects often cause light emissions in the infrared or visible light spectrum, which can be detected in the captured images taken during EMMI analysis. A focused laser is applied in OBIRCH analysis which induces a photocurrent in the device. Differences in the photocurrent image can be compared against reference images to reveal circuit-level problems within the device. By detecting and localizing integrated circuit failures within the chips, these failure analysis techniques can be used to discover failures in the manufacture of the integrated circuit and package and enhance the quality control of the manufacturing operation.

However, testing often requires the integrated circuit to be probed or electrically connected to for further analysis. One difficulty with using failure analysis techniques is that directly probing of the integrated circuit contained within the BGA package can often can lead to short circuits and problems with the circuit due to the sensitive nature of the chip connections and parts. In addition, the exposed bond wires are fragile and can easily be broken or accidentally disconnected during testing. Furthermore, probing or connecting to the solder balls on the BGA package is difficult in that the exposed solder balls are located on the backside of the decapsulated BGA sample. Additionally, the round shape of the solder balls may cause problems in maintaining an electrical connection from the solder balls to testing equipment.

From the above, it can be seen that an improved technique for testing of BGA packages is desired.

BRIEF SUMMARY OF THE INVENTION

The present invention is directed to integrated circuits and their processing for the manufacture of semiconductor devices. More particularly, the invention provides a method and apparatus for supporting BGA packages during one or more testing processes. Merely by way of example, the invention can be used to perform testing of the BGA packages without having to directly test the electrical components located within the BGA package. But it would be recognized that the invention has a much broader range of applicability.

In a specific embodiment of the invention, an apparatus for supporting BGA packages for one or more testing processes is disclosed. The apparatus includes a substrate member. The substrate member has a plurality of contact pads, with each of the contact pads being spatially disposed around a peripheral region of the substrate. The apparatus further includes a plurality of contact regions spatially configured on a portion of the substrate member. Each of the plurality of contact regions is numbered from 1 through N being electrically connected to respective contact pads numbered from 1 through N. The plurality of contact regions is configured to provide electrical contact to respective plurality of balls provided on a BGA package. The apparatus additionally includes a holder device coupled to the substrate member. The holder device is adapted to mechanically hold the BGA package in place to provide mechanical contact between the plurality of balls and respective plurality of contact regions.

In another specific embodiment of the invention, a method of testing a BGA package is disclosed. The method includes providing a BGA package for electrical testing. The BGA package comprises at least at least a plurality of solder balls. The method also includes providing a BGA package holder. The BGA package holder comprises a substrate member having a plurality of contact pads, The BGA package holder also comprises a plurality of contact regions spatially configured on a portion of the substrate member. The plurality of contact regions are configured to provide electrical contact to respective plurality of balls provided on a BGA package. Furthermore, the BGA package holder comprises a holder device coupled to the substrate member. In addition, the method includes coupling the BGA package with the BGA package holder. Moreover, the method includes performing one or more tests on the BGA package by utilizing the BGA package holder.

Many benefits are achieved by way of the present invention over conventional techniques. For example, the present technique provides an easy to use apparatus and method that relies upon conventional technology. In addition, an apparatus is provided for testing of a BGA package without having to directly test the electrical components located within the BGA package. Electrical connections are made from the solder balls on the BGA package to more accessible output pads located on the BGA package holder so that direct probing or connecting to the electrical components in the BGA package is not required. The risk of additional damage caused by directly contacting the electrical components in the BGA package is correspondingly reduced. In a specific embodiment, the invention provides a secure housing so that the BGA package will not be damaged or dislodged during testing. In another specific embodiment, testing of the BGA package is simplified by associating the solder balls in the BGA package with output pads on the BGA package holder. Additionally, the method provides a process that is compatible with conventional processing technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and apparatus for supporting BGA packages during one or more testing processes. Merely by way of example, the invention can be used to perform testing of the BGA packages without having to directly test the electrical components located within the BGA package. But it would be recognized that the invention has a much broader range of applicability.

Figure 1:
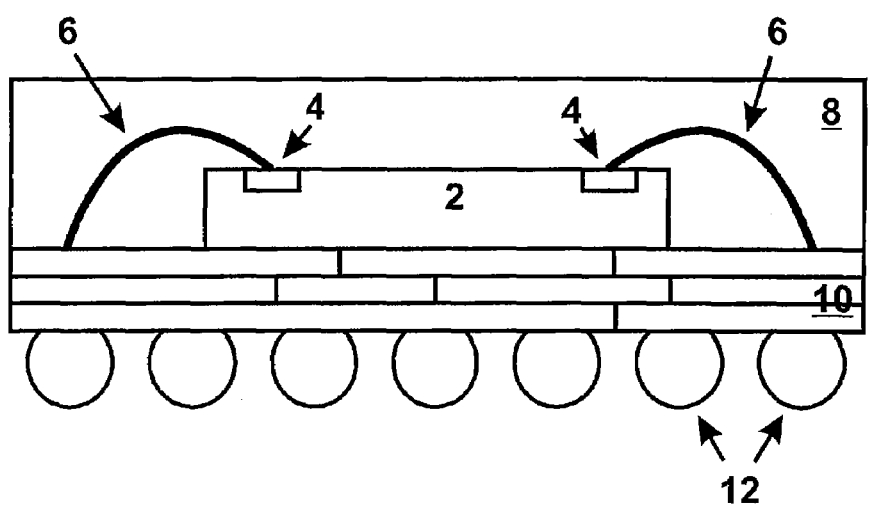
FIG. 1 is a simplified conventional diagram of an integrated circuit coupled to a ball grid array package.

FIG. 1 is a simplified conventional diagram of an integrated circuit coupled to a ball grid array package. BGA package 100 may be one of a variety of specific BGA packages, including but not limited to PBGA, uBGA, full matrix BGA, SBGA, TBGA, CBGA, and FBGA packages. Integrated circuit 2 is first formed on a silicon die and prepared for packaging. Bond pads 4 are formed on a surface region of integrated circuit 2, allowing the circuit to be electrically connected to wiring board 10 through wiring 6. For example, wiring 6 may comprise metallic bond wires which extend from bond pads 4 to wiring board 10. Encapsulant layer 8 is formed covering integrated circuit 2, bond wires 6, and a portion of wiring board 10 in a protective layer that protects integrated circuit 2 and its wiring from the external environment, while still enabling electrical conductivity and heat release through the encapsulant material. For example, encapsulant layer 8 may be formed from an epoxy resin material or plastic material. Wiring board 10 may be a high-performance multilayer wiring board constructed from a laminate material that has several layers of conductors and insulators to provide a plurality of distinct electrical connections from the integrated circuit. Wiring board 10 has an area array of external terminals such as solder balls 10 laid out on a surface region of the package. By arranging solder balls 10 in an array, BGA package 100 can be formed with a large number of high-density terminals.

Figure 2:
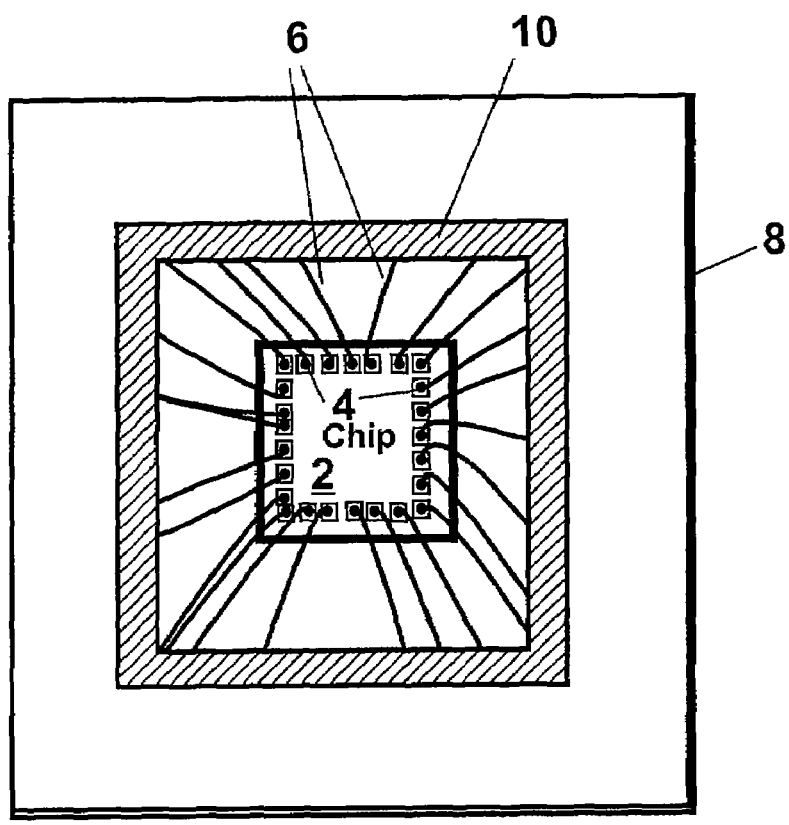
FIG. 2 is a simplified conventional diagram of a top-view of an integrated circuit coupled to a BGA package after decapsulation.

FIG. 2 is a simplified conventional diagram of a top-view of an integrated circuit coupled to a BGA package after decapsulation. A decapsulation process is performed to remove a portion of encapsulant 8 from BGA package 100 to facilitate the inspection or examination of the die and internal features of the package. Following the decapsulation process, integrated circuit 2 and wiring board 10 are exposed so that further testing or analysis of integrated circuit 2 or its wiring can be performed. Bond pad regions 4 on integrated circuit 2 are connected to wiring board 10 through bond wires 6. Portions of encapsulant layer 8 may still present following the decapsulation process.

Figure 3:
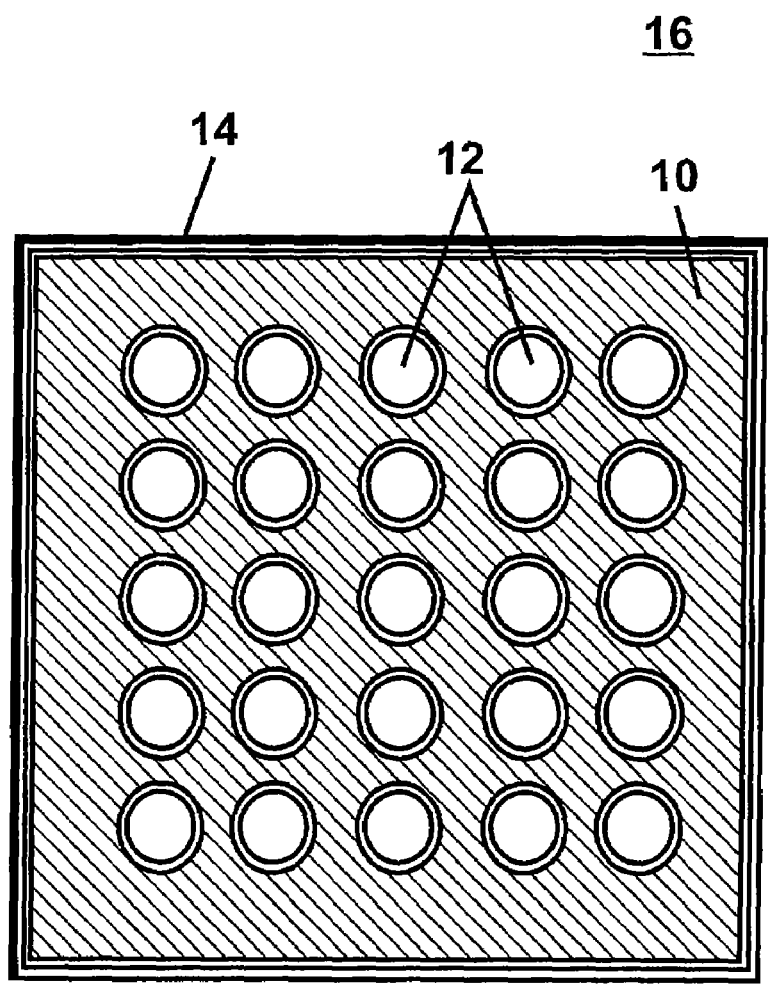
FIG. 3 is a simplified conventional diagram of a bottom-view of a BGA package.

FIG. 3 is a simplified conventional diagram of a bottom-view of a BGA package. Solder balls 10 are arranged in an array to provide the BGA package with an external electrical interconnection to circuit boards. One of the primary advantages of using a BGA package is the high interconnection density in that the number of package pins or solder balls offered for the package area is high. For example, solder balls 12 can be arranged in a square or rectangular array on bottom region 16 of the BGA package to provide an optimum interconnection density for the package area. As shown in FIG. 3, an exemplary configuration for solder balls 12 may be a 5 by 5 configuration, but other configurations could also be used. Solder balls 12 are attached to wiring board 10 and provide an electrical connection from the integrated circuit through the wiring board and solder balls to the circuit board. A protective outside layer 14 may be used at the exterior or bottom of the device to protect the BGA package from damage or contamination.

Figure 4:
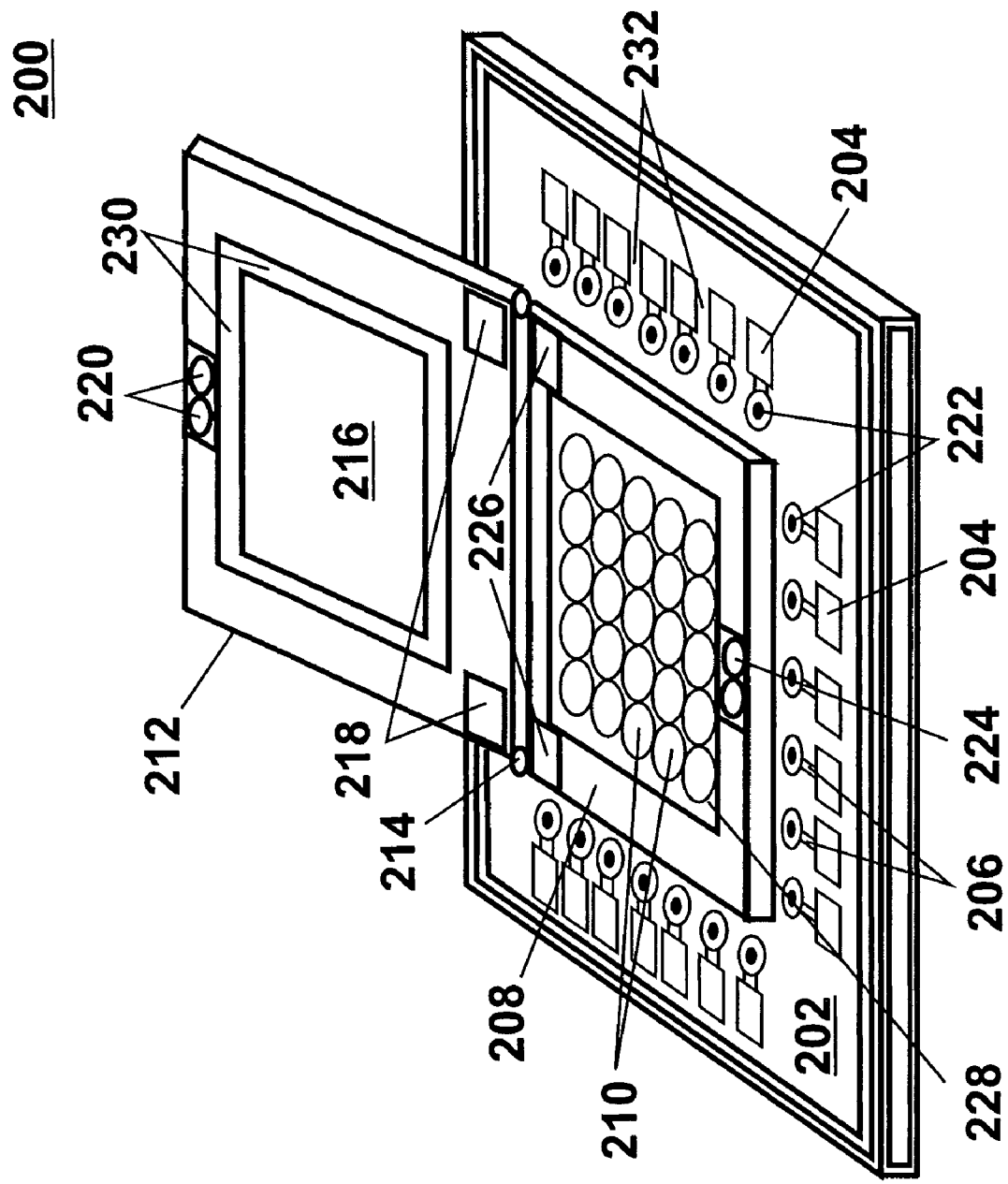
FIG. 4 is a simplified exemplary diagram of a BGA package holder according to an embodiment of the present invention.

FIG. 4 is a simplified exemplary diagram of a BGA package holder according to an embodiment of the present invention. This diagram is merely an example, which should not unduly limit the scope of the claims. One of ordinary skill in the art would recognize many variations, alternatives, and modifications. BGA package holder 200 can be used to support a BGA package for one or more testing processes, such as EMMI or OBIRCH analysis. BGA package holder 200 provides an apparatus for testing of a BGA package without having to directly test the electrical components located within the BGA package, for example the bond pads, solder balls, or wiring. Instead, electrical connections are made from the solder balls on the BGA package to more accessible output pads located on BGA package holder 200 so that direct probing of the electrical components in the BGA package is not required. By testing the integrated circuit using the output pads which are electrically connected to the integrated circuit within the BGA package, damage caused by probing the electrical components in the BGA package can be minimized. Of course, there can be other variations, modifications, and alternatives.

A substrate member 202 is part of BGA package holder 200 and provides a conductive interface so that the integrated circuit within the BGA package can be tested without directly probing the circuit or the interconnections within the BGA package. For example, substrate member 202 may be a printed circuit board member. Substrate member 202 possesses a plurality of output pads 204 connected to vias 206 through metal connect lines 222. Each of the output pads 204 is spatially disposed around a peripheral region of substrate member 202. Vias 206 are connected through the backside of substrate 202 to periphery vias (not shown). The periphery vias connect to the plurality of contact regions 210 on the backside of substrate member 202. Output pads 204 are of a sufficient size to facilitate contact with probing or testing equipment used to test the BGA package. For example, aluminum, copper, or other conductive materials may be used to form output pads 204 and metal connect lines 222. Alternatively, a copper coating may be used to coat output pads 204 or metal connect lines 222. In another example, the size of each of the plurality of contact pads may be two to three millimeters. Nonconductive regions 232 of substrate member 202 are located between each of output pads 204 to prevent any accidental contact between adjacent output pads 204. Of course, there can be other variations, modifications, and alternatives.

Holder device 208 is coupled to substrate member 208 in the center of substrate member 202, but may also be located on different areas of substrate member 208 depending upon the specific implementation being used. The holder device may be formed from a plastic or resin material. Holder device 208 contains an array of contact regions 210 spatially configured on a portion of substrate member 202 within contact region portion 228. A top portion of contact regions 210 are exposed on holder device 208 and a bottom portion of contact regions 210 are exposed on the backside of BGA package holder 200. Contact regions 210 provide electrical contact to the plurality of solder balls provided on a BGA package. Contact regions 210 may be further arranged in an array to fit the specific ball grid array arrangement used within the BGA package being tested. For example, contact regions 210 may be configured in a 5 by 5 arrangement to fit a 5 by 5 ball grid array arrangement for the BGA package. Of course, there can be other variations, modifications, and alternatives.

Holder device 208 is further adapted to mechanically hold the BGA package in place to provide mechanical contact between the plurality of balls on the BGA package and the respective plurality of contact regions 210. A foldable lid assembly 212 may be employed to maintain the position of the BGA package. For example, hinge 214 may be used to provide an open position so that the decapsulated BGA package may be placed within BGA package holder 200. Foldable lid assembly 212 can be closed after the BGA package has been positioned to provide a secure housing for the BGA package during testing. Magnets 218 and 220 located on foldable lid assembly 212 are coupled with magnets 224 and 226 after the BGA package has been placed to secure and close the BGA package. In a specific embodiment, section 216 of foldable lid assembly 212 is an opening to allow for thermal or photocurrent imaging of the chip to be performed while the BGA package is secured to BGA package holder 200. The exact size of the empty area may be selected to allow for the majority or entirety of the BGA package to be viewed from the top portion of the BGA package holder. Additionally, peripheral lid regions 230 may be included to apply an amount of downwards pressure on the BGA package to prevent the BGA package from shifting during testing. Peripheral lid regions 230 are attached to lid 212. When lid 212 is closed, peripheral lid regions 230 are positioned to exert a downwards pressure on the BGA package to further secure its position within BGA package holder 200 and maintain a reliable electrical interconnection between the BGA package and BGA package holder 200. Of course, there can be other variations, modifications, and alternatives.

One additional benefit to using BGA package holder 200 is that testing may be performed on the BGA package without decapsulating the package. For example, the BGA package can be coupled to BGA package holder 200 without having the BGA package first undergo a decapsulation procedure. A variety of electrical tests can be performed to verify the correct operation of the integrated circuit and characterize the performance of the integrated circuit and the BGA package. Of course, there can be other variations, modifications, and alternatives.

Another benefit to using BGA package holder 200 is that the correspondence between the solder balls on the BGA package and output pads 204 can be easily determined. During testing of a BGA package, it is difficult to determine the correspondence between the solder balls on the package and the bond pads on the integrated circuit, making direct testing of the BGA package difficult and unreliable. By providing a reliable electrical connection between output pads 204 on BGA package holder 200 and the solder balls on the BGA package, the individual bond pads on the integrated circuit can be indirectly tested by probing output pads 204 on BGA package holder 200. Of course, there can be other variations, modifications, and alternatives.

Figure 5:
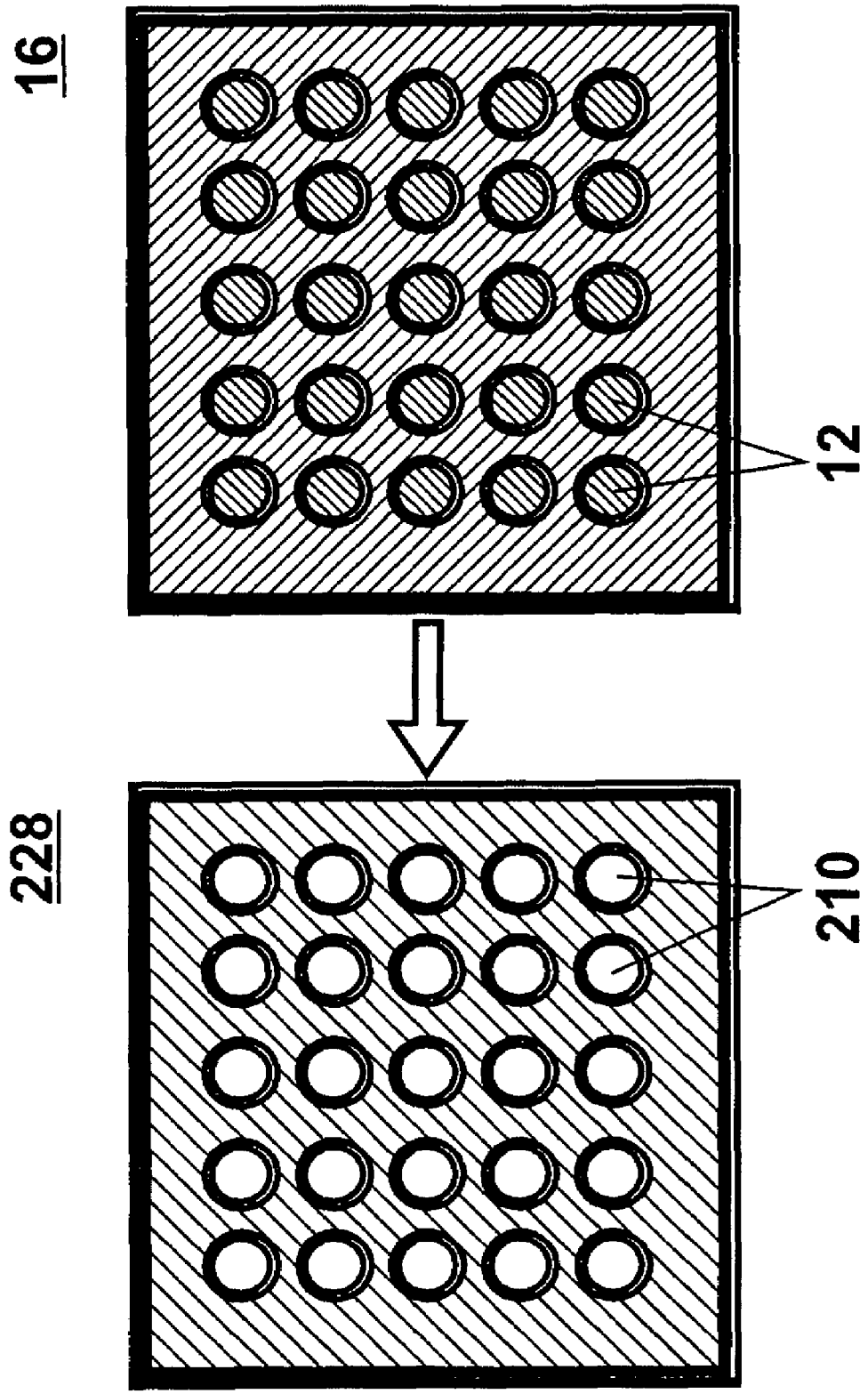
FIG. 5 is a simplified exemplary diagram showing the correspondence between the ball grid array on the BGA package and the package pins according to an embodiment of the present invention.

FIG. 5 is a simplified exemplary diagram showing the correspondence between the ball grid array on the BGA package and the package pins according to an embodiment of the present invention. This diagram is merely an example, which should not unduly limit the scope of the claims. One of ordinary skill in the art would recognize many variations, alternatives, and modifications. A plurality of solder balls 12 is arranged in a square or rectangular array on bottom region 16 of the BGA package. Contact region portion 228 of the BGA package holder contains contact regions 210 arranged in a similar array to that of the BGA package so that a one-to-one correspondence may be achieved between the plurality of solder balls 12 and the respective plurality of contact regions 210. The shape of contact regions 210 is designed to maintain contact with solder balls 12 used within the BGA package. For example, contact regions 210 may be formed with a hemispherical shape and a sufficient depth to allow solder balls 12 to be coupled to them. Of course, there can be other variations, modifications, and alternatives.

Figure 6:
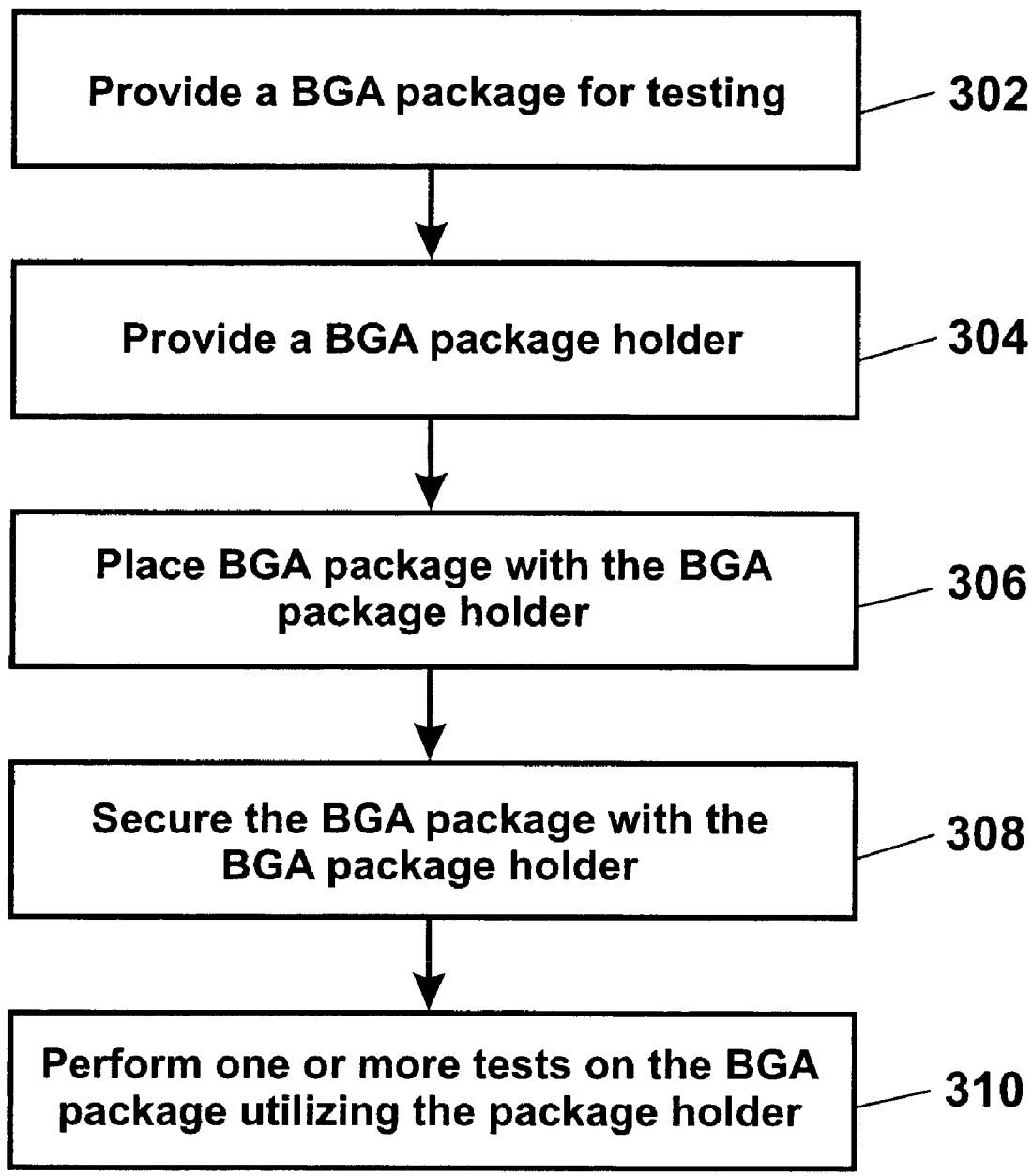
FIG. 6 is a simplified exemplary flowchart for testing a BGA package according to an embodiment of the present invention.

FIG. 6 is a simplified exemplary flowchart for testing a BGA package according to an embodiment of the present invention. BGA testing process 300 includes a process 302 for providing a BGA package for testing, a process 304 for providing a BGA package holder, a process 306 for placing the BGA package with the BGA package holder, process 308 for securing the BGA package with the BGA package holder, and a process 310 for performing one or more tests on the BGA package utilizing the package holder. This diagram is merely an example, which should not unduly limit the scope of the claims. One of ordinary skill in the art would recognize many variations, alternatives, and modifications.

In process 302, a BGA package is provided for testing. For example, the BGA package may have already been decapsulated and is ready for further analysis or testing such as EMMI or OBIRCH analysis. In process 304, BGA package holder 200 is provided. In process 306, BGA package is placed with BGA package holder 200 so that the solder balls 12 on the BGA package are in contact with contact regions 210 on BGA package holder 200. Process 306 may also include an additional process for aligning contact regions 210 of BGA package holder 200 to the plurality of solder balls provided on the BGA package. If a foldable lid assembly 212 is included within BGA package 200, an additional process 308 of securing the BGA package with the BGA package holder may be performed. For example, during process 308, the foldable lid assembly is pivoted on its hinge to cover holder device 208 and further secure the BGA package. Additional latching devices such as magnets or other devices may be used to secure the BGA package. After the BGA package has been properly secured, process 310 may be performed whereby one or more tests are performed on the BGA package utilizing the BGA package holder. For example, EMMI or OBIRCH analysis may be performed during process 310. The testing may be performed by probing output pads 204 on BGA package holder 200 during analysis instead of directly probing the integrated circuit or the BGA package. Of course, there can be other variations, modifications, and alternatives.

Figure 7:
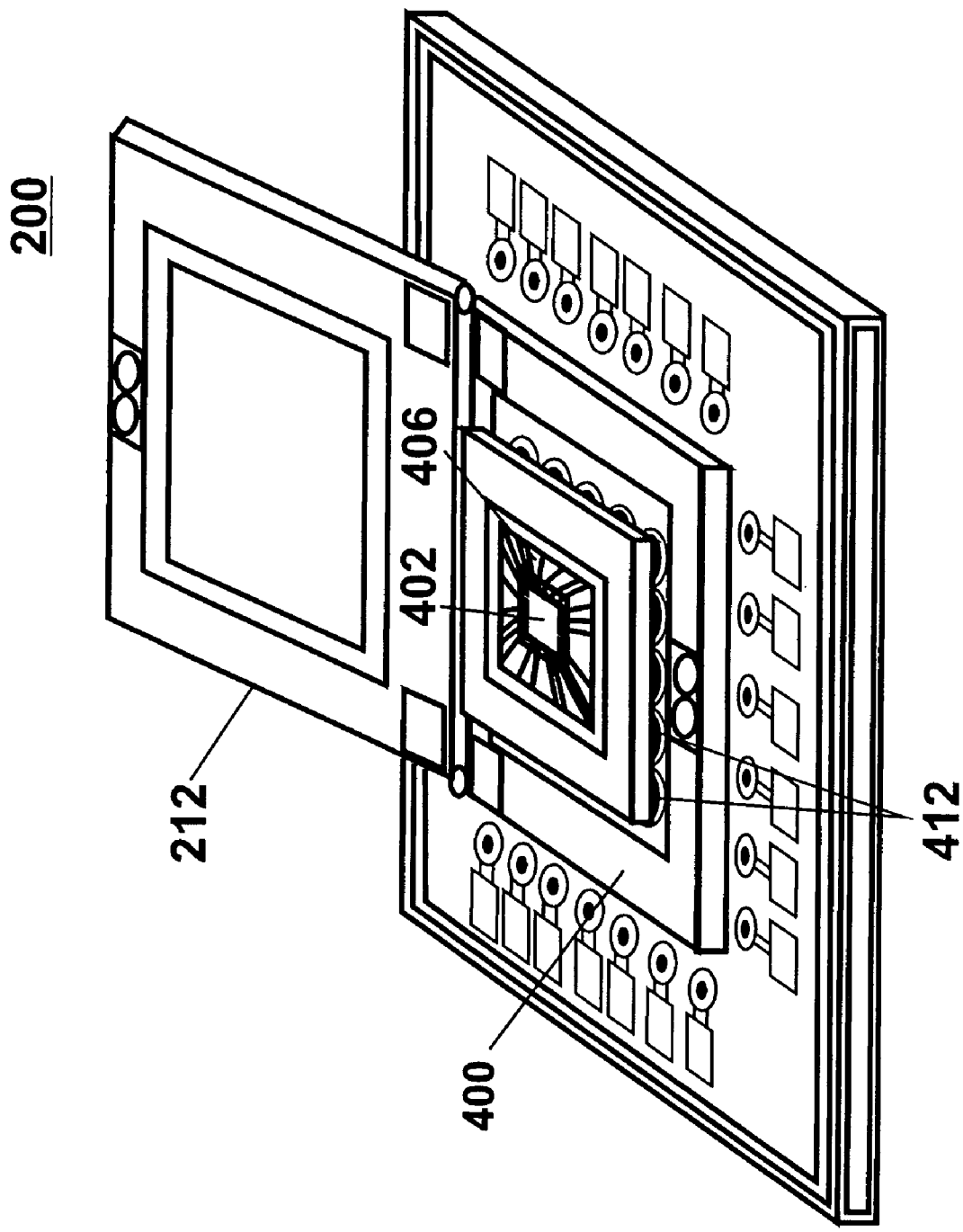
FIG. 7-9 are simplified exemplary diagrams showing a BGA package coupled to a BGA package holder according to embodiments of the present invention.

FIG. 7 is a simplified exemplary diagram showing a BGA package coupled to a BGA package holder according to an embodiment of the present invention. This diagram is merely an example, which should not unduly limit the scope of the claims. One of ordinary skill in the art would recognize many variations, alternatives, and modifications. In FIG. 7, decapsulated BGA package 400 is coupled to BGA package holder 200. Integrated circuit 402 and bond wires 404 can be seen on the BGA package following the decapsulation process. BGA package 400 has been placed so that solder balls 412 are in contact with the contact regions (not shown) on BGA package holder 200. Foldable lid assembly 212 is open and has not been closed to fully secure BGA package 400 to BGA package holder 200. Of course, there can be other variations, modifications, and alternatives.

Figure 8:
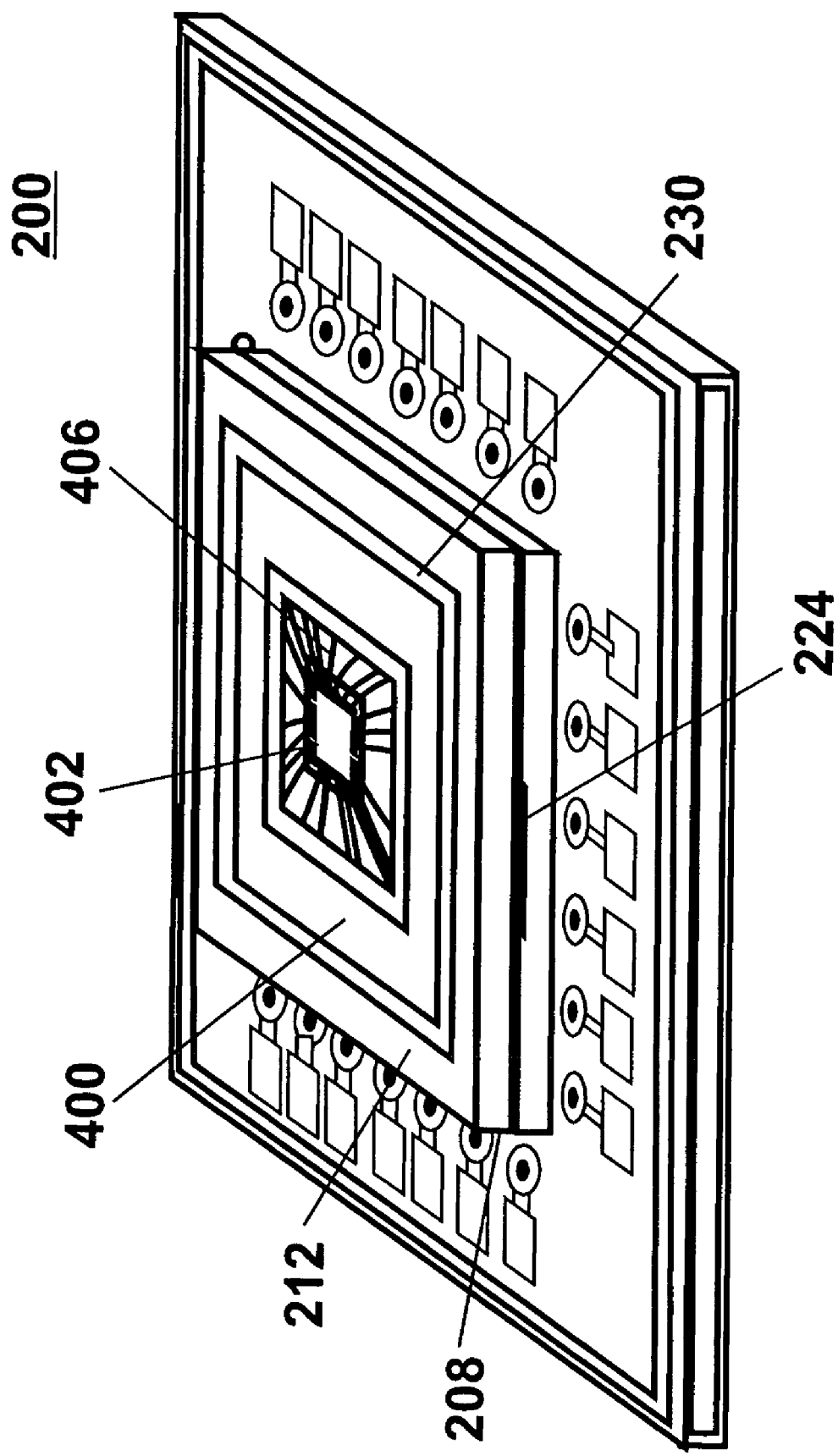

FIG. 8 is a simplified exemplary diagram showing a BGA package coupled to a BGA package holder according to an embodiment of the present invention. This diagram is merely an example, which should not unduly limit the scope of the claims. One of ordinary skill in the art would recognize many variations, alternatives, and modifications. In FIG. 8, foldable lid assembly 212 has been folded to close holder device 208 and secure BGA package 400 within BGA package holder 200. Magnets 224 and others are used to maintain lid assembly 212 in a closed position until testing has been completed. Peripheral lid regions 230 are positioned so that when lid assembly 212 is closed, a downwards pressure is exerted by peripheral lid regions 230 so that BGA package 400 is secured into place. Integrated circuit 402 and bond wires 406 are exposed by the opening within foldable lid assembly 212. Of course, there can be other variations, modifications, and alternatives.

Figure 9:
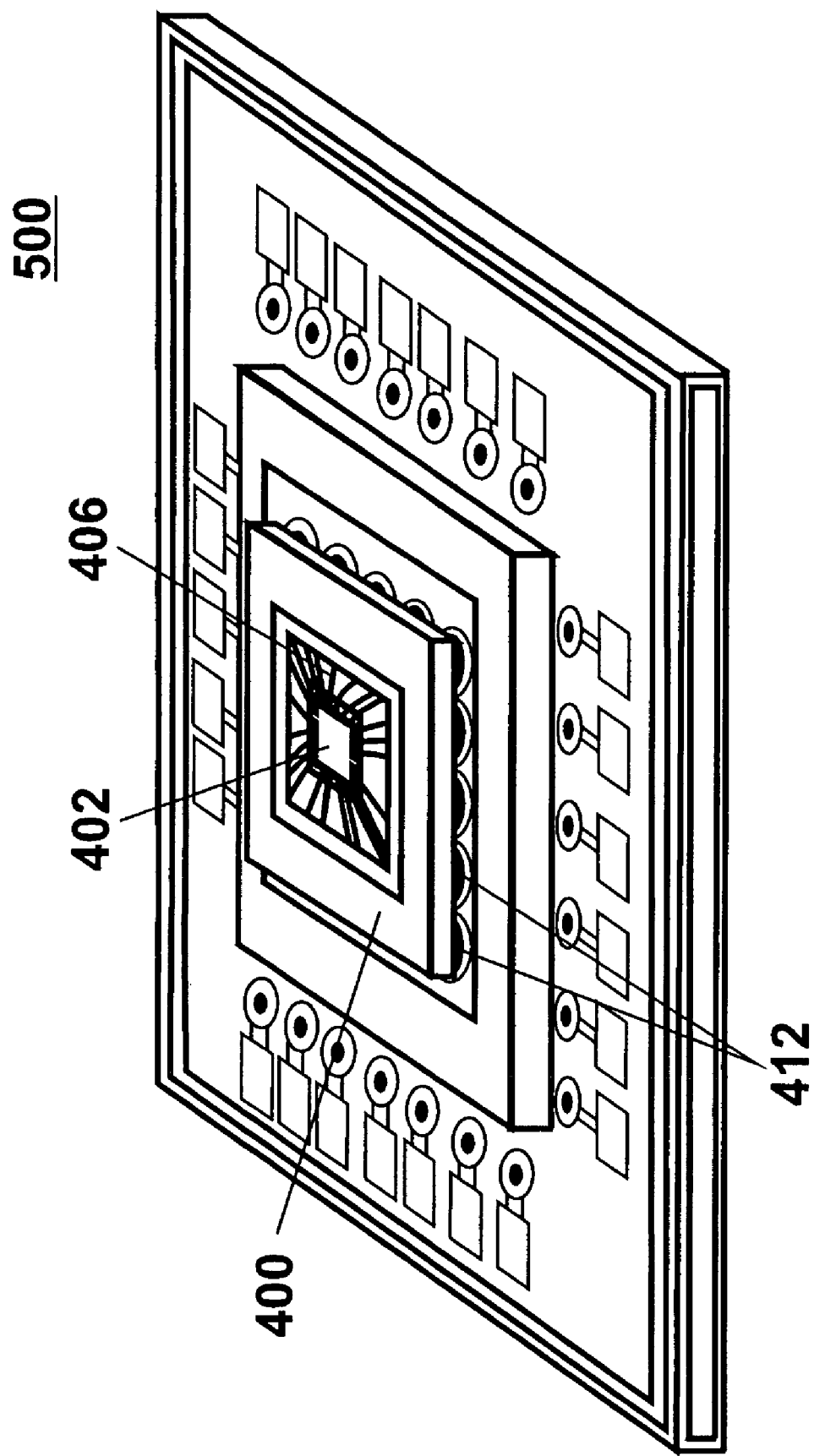

FIG. 9 is a simplified exemplary diagram showing a BGA package coupled to a BGA package holder according to an embodiment of the present invention. This diagram is merely an example, which should not unduly limit the scope of the claims. One of ordinary skill in the art would recognize many variations, alternatives, and modifications. Within FIG. 9, no lid assembly is included within BGA package holder 500. BGA package holder 500 and BGA package holder 200 share similar characteristics, with the exception of the exclusion of the foldable lid assembly on BGA package 500. For example, similar features on BGA package holder 200 may be located on BGA package 500, and vice versa. The weight of BGA package 400 is used to keep solder balls 412 in contact with contact regions (not shown) on BGA package holder 500. Additionally, the shape of the contact regions corresponds to the shape of solder balls 412 to enable the contact regions to further maintain contact with solder balls 412. Integrated circuit 412 and bond wires 406 are exposed on the top portion of BGA package 400. Of course, there can be other variations, modifications, and alternatives.

Figure 10:
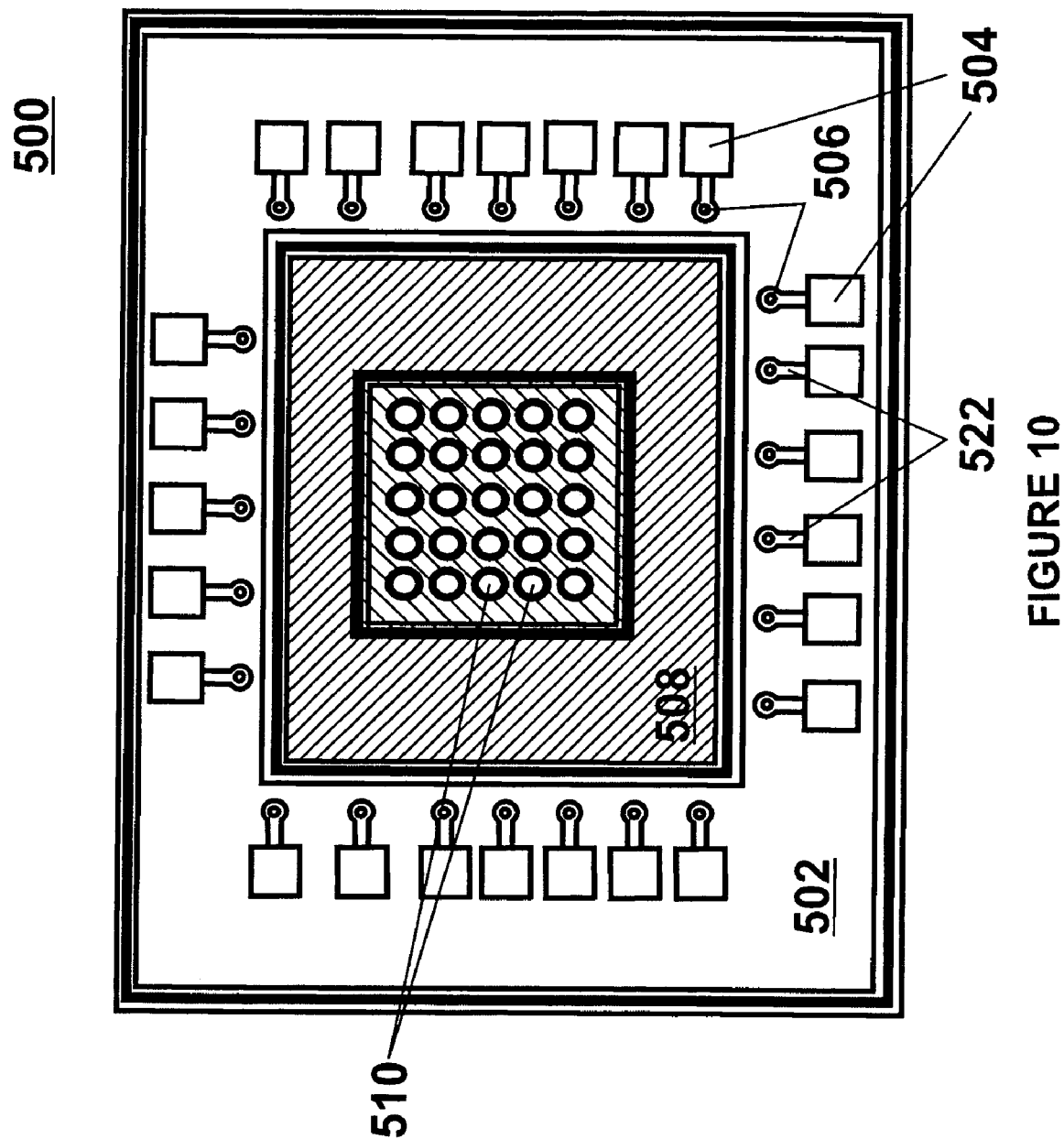
FIG. 10 is a simplified exemplary diagram showing a top view of the BGA package holder without the lid according to an embodiment of the present invention.

FIG. 10 is a simplified exemplary diagram showing a top view of the BGA package holder without the foldable lid according to an embodiment of the present invention. This diagram is merely an example, which should not unduly limit the scope of the claims. One of ordinary skill in the art would recognize many variations, alternatives, and modifications. A foldable lid assembly has not been included with BGA package holder 500. Output pads 504, vias 506, and metal connect lines 522 are spatially disposed on the periphery of substrate 502. For example, output pads 504, vias 506, and metal connect lines 522 may surround holder device 508 on four different sides. Contact regions 510 are arranged in an array to correspond with the ball grid array of solder balls in the BGA package to be used with BGA package holder 500. The hemispherical shape of contact regions 510 allows for electrical contact to be maintained with the spherical shape of the solder balls in the BGA package. Of course, there can be other variations, modifications, and alternatives.

Figure 11:
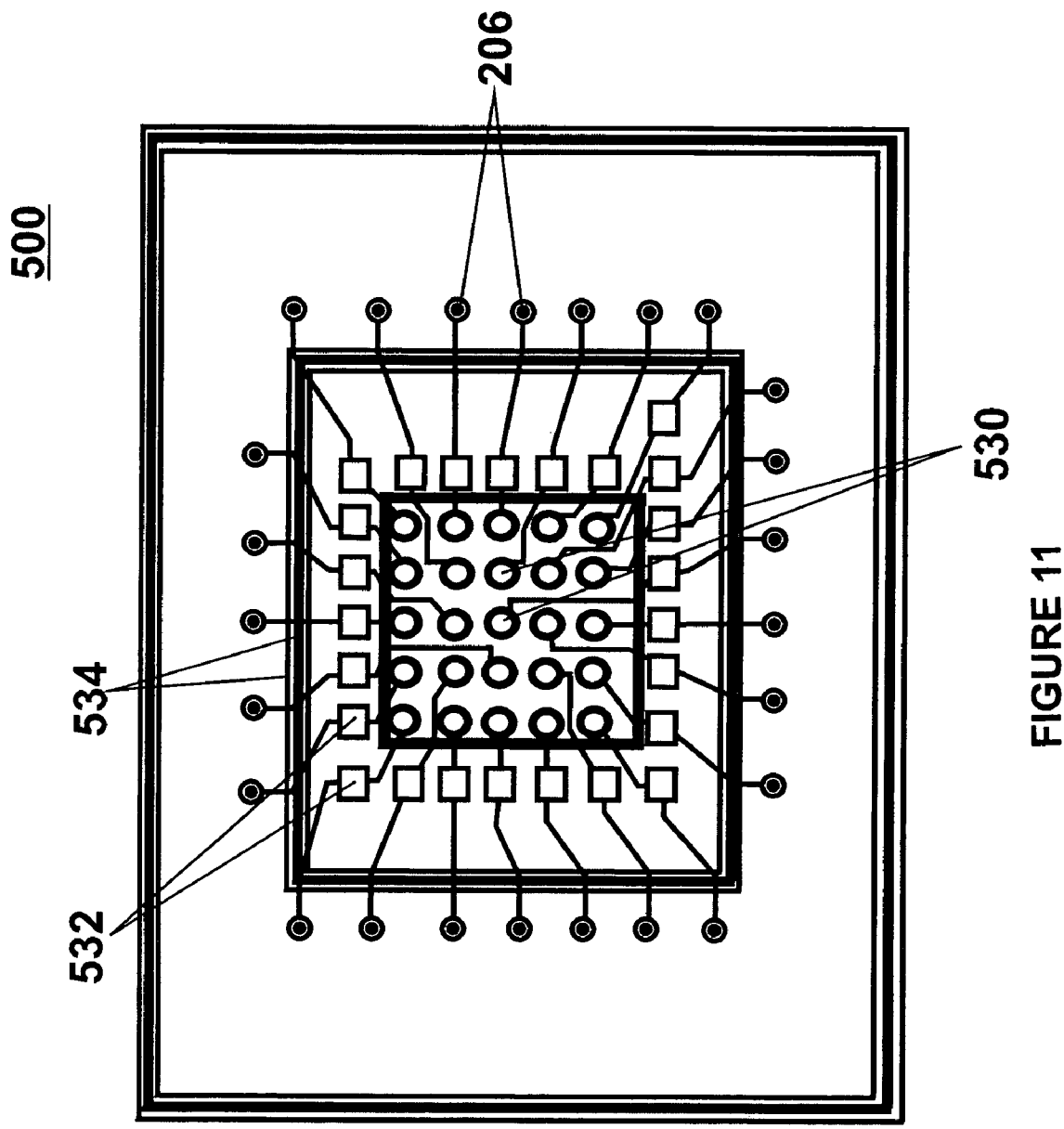
FIG. 11 is a simplified exemplary diagram showing a bottom view of the BGA package holder according to an embodiment of the present invention.

FIG. 11 is a simplified exemplary diagram showing a bottom view of the BGA package holder according to an embodiment of the present invention. This diagram is merely an example, which should not unduly limit the scope of the claims. One of ordinary skill in the art would recognize many variations, alternatives, and modifications. The backside of BGA package holder 500 is shown, revealing the interconnections between the contact regions and the output pads on the top portion of BGA package holder 500. Bottom portions 530 of the contact regions (not shown) are each connected to periphery vias 534, which lead to vias 206. Vias 206 run from the bottom of BGA package holder 500 to the top of BGA package holder 500, connecting to metal interconnect lines and output pads (not shown). Via support regions 532 may be used to support periphery vias 534 as they extend from the bottom portions 530 of the contact regions to vias 206. Bottom portions 530 of the contact regions are each connected through periphery vias 534 in a one-to-one manner, so that each of the contact regions can be directly probed by using the output pads on the top portion of BGA package holder 500. During testing, each of the solder balls on the BGA package can be mapped to a known output pad, thus simplifying subsequent testing and analysis procedures. Of course, there can be other variations, modifications, and alternatives.

While a BGA package holder has been described herein, it is to be understood that other embodiments of the BGA package holder using the same concepts described herein could also be implemented. For example, different arrays of contact regions could be utilized to fit BGA packages containing different sizes or arrangements of solder ball arrays. In addition, different securing methods could be used to keep the BGA package secured to the BGA package holder during testing. For example, latches or other securing devices could be employed in place of or in addition to the magnets used in an embodiment of the present invention. Alternatively, a different configuration of the output pads, metal interconnect lines, and vias could be utilized instead of having the output pads, metal interconnect lines, and vias being located on the periphery of the substrate member. For example, the holder device for the BGA package could be located on side of the device with the plurality of output pads, metal interconnect lines, and vias all located on one side of the BGA package holder. In another example, the BGA package holder may also include an image capture device used to capture an image of the die on the BGA package, the image being associated with a thermal profile of the chip. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for supporting BGA packages for one or more testing processes, the apparatus comprising:
   a substrate member,
   a plurality of contact pads directly disposed on the substrate member, each of the contact pads being spatially disposed around a peripheral region of the substrate;
   a plurality of contact regions spatially configured on a portion of the substrate member, each of the plurality of contact regions numbered from 1 through N being electrically connected to respective contact pads numbered from 1 through N, the plurality of contact regions being configured to provide electrical contact to respective plurality of balls provided on a BGA package such that electrical connections are made from the respective plurality of balls on the BGA package to the respective contact pads, thereby preventing direct probing of electrical components in the BGA package during the one or more testing processes; and
   a holder device coupled to the substrate member, the holder device being adapted to mechanically hold the BGA package in place to provide mechanical contact between the plurality of balls and respective plurality of contact regions.

2. The apparatus of claim 1 wherein the substrate member is a printed circuit board member.

3. The apparatus of claim 1 wherein the holder device comprises an opening to expose a face of the BGA package.

4. The apparatus of claim 1 wherein the holder device comprises an opening to expose a die provided on the BGA package.

5. The apparatus of claim 4 further comprising a image capture device used to capture an image of the die on the BGA package, the image being associated with a thermal profile of a chip.

6. The apparatus of claim 1 wherein the plurality of contact regions comprise a copper coating.

7. The apparatus of claim 1 wherein the plurality of pads comprise a copper material.

8. The apparatus of claim 1 wherein each of the plurality of pads has a size of about two to three millimeters.

9. The apparatus of claim 1 wherein the holder device comprises a latching device to maintain the BGA package in place.

10. The apparatus of claim 9 wherein the latching device comprises a magnet used to maintain the BGA package in place.

11. The apparatus of claim 1 wherein the BGA package is decapped.

12. The apparatus of claim 1 wherein the BGA package is completely packaged.

* * * * *